United States Patent [19]
Hsu et al.

[11] Patent Number: 5,994,198
[45] Date of Patent: Nov. 30, 1999

[54] FABRICATION METHOD FOR FULLY LANDING SUBMINIMUM FEATURES ON MINIMUM WIDTH LINES

[75] Inventors: Louis L. Hsu, Fishkill; Jack A. Mandelman, Stormville, both of N.Y.; William R. Tonti, Essex Junction, Vt.

[73] Assignee: International Business Machines Corporation, Armonk, N.Y.

[21] Appl. No.: 09/027,544

[22] Filed: Feb. 23, 1998

[51] Int. Cl.[6] .................................................. H01L 21/76
[52] U.S. Cl. ........................... 438/401; 438/462; 438/689
[58] Field of Search ..................... 438/401, 462, 438/928, 689; 430/296, 312, 313, 967; 148/DIG. 137

[56] References Cited

U.S. PATENT DOCUMENTS 4,767,723  8/1988  Hinsberg, III et al. .................. 438/160
5,501,926  3/1996  Cheng et al. ................................. 430/5
5,776,660  7/1998  Hakey et al. ............................. 430/296

*Primary Examiner*—Charles Bowers
*Assistant Examiner*—Craig Thompson
*Attorney, Agent, or Firm*—John J. Goodwin

[57] ABSTRACT

A method for forming a multilayer structure having a dimension at most substantially equal to the minimum printable image wherein a substrate structure including a lithographic feature having a first minimum printable image dimension has a layer of hybrid photoresist disposed thereon above the lithographic feature of the substrate. A mask is provided over the hybrid photoresist layer with the mask having an edge aligned with the lithographic feature to within the tolerance of the semiconductor processing technology. The hybrid photoresist layer is exposed through the mask and developed to provide a window opening in the photoresist layer which is at most substantially equal to the minimum printable image.

10 Claims, 6 Drawing Sheets

5,994,198

FABRICATION METHOD FOR FULLY LANDING SUBMINIMUM FEATURES ON MINIMUM WIDTH LINES

BACKGROUND OF THE INVENTION

1. Technical Field

The present invention relates to multiple layer integrated circuit fabrication, and more particularly to a method for forming a subminimum size feature on a structure having a minimum or subminimum width.

2. Background Art

In integrated circuit fabrication of multiple layer structures it is frequently required that a second structure be formed on a first structure without the edge of the second structure extending beyond the edge of the first structure. Also, it may be required that the first structure have a width which is the minimum or subminimum size defined by the lithography employed in the fabrication.

For example, in forming a contact opening such as a via between two wiring levels as shown in FIG. 1 it is important that the subminimum via opening 10 in the dielectric layer 12 does not overlap the edge of an underlying conductor 14.

Another example is the formation of a contact 16 to a diffusion 18 disposed between two gate conductors 20a and 20b as shown in FIG. 2 wherein it is important that the contact 16 does not short to either gate conductor 20a or 20b. This would eliminate the need for a robust etch barrier when forming a borderless contact to a diffusion.

A third example as shown in FIG. 3 is the case wherein it is desirable to minimize the depth of a Shallow Trench Isolation (STI) 22 within a substrate 24 in order to reduce the aspect ratio of the trench and facilitate filling the trench with an insulating material.

Problems occur in the prior art fabrication techniques of FIG. 3. The presence of the full isolation implant through the implant window in photoresist layer 28 into the active device area such as area 26a requires the STI 22 be made deeper to prevent interaction with the devices. This happen when the isolation implant window misaligns with the STI, which occurs on a random basis. Since the isolation implant peak needs to be approximately at the bottom of the STI, deep STI moves the relatively high isolation doping concentration away from the surface of the device. Also, when the field implants are done prior to STI filling while the pad nitride layer covers the active areas 26a and 26b, then the filled implant self aligns with the STI 22. Subsequent high temperature steps will significantly diffuse any implant aligned to the STI region into the active device regions producing increased sensitivity, increased junction capacitance and enhanced fields within the silicon. Furthermore, the substrate hot carrier effect becomes a significant design constraint when minimum isolation depth is desired.

An example of a prior art technique is disclosed in the publication "Doping Profile Design For Substrate Hot Carrier Reliability In Deep Submicron Field Effect Transistors," Tonti et al., 29'th Annual International Reliability Physics Symposium.

The present invention uses what is referred to as a dual tone or hybrid photoresist. Dual tone or hybrid photoresists and their application are disclosed in co-pending U.S. patent applications Ser. No. 08/715,287, filed Sep. 16, 1996, entitled FREQUENCY DOUBLING HYBRID PHOTORESIST; Ser. No. 08/715,288, filed Sep. 16, 1996, entitled LOW "K" FACTOR HYBRID PHOTORESIST; and Ser. No. 08/851,973, filed May 7, 1997, entitled ESD PROTECTION STRUCTURE AND METHOD.

SUMMARY OF THE INVENTION

An object of the present invention is to provide a method for fabricating multiple layer integrated circuit structures wherein a subminimum size feature is fully landed on a structure having a minimum or subminimum width.

Another object of the present invention is to provide a method for integrated circuit fabrication wherein a second structure is formed on a first structure without the second structure extending beyond the edge of the first structure where the first structure has a width which is minimum or subminimum lithographic width.

A further object of the present invention is to provide a method that uses a dual tone or hybrid photoresist for fabricating an integrated circuit structure to assure that a contact via of the structure is fully landed on the underlying conductor.

Still another object of the present invention is to provide fabrication methods and integrated DRAM circuit device structures that assure that a borderless contact does not short to an adjacent gate conductor.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms Like numerals refer to like parts throughout the disclosure.

DETAILED DESCRIPTION OF THE INVENTION

The present invention overcomes the disadvantages of the prior art fabrication techniques for multilayer structures and provides a method for forming a structure having a dimension substantially equal to the minimum lithographic printable image. The invention employs a hybrid photoresist, also known as a dual tone photoresist.

A description of the resist pattern resulting from the exposure and development of a dual tone photoresist is disclosed in co-pending U.S. patent application Ser. No. 08/715,287 entitled "Frequency Doubling Hybrid Photoresist" filed Sep. 16, 1996.

In the method of the present invention, dual tone photoresist is used to assure that the field implant of the device structure does not encroach on the active device area, and assures that the contact via is fully landed on the underlying conductor, and further assures that the borderless contact does not short to an adjacent gate conductor.

Figure 1:
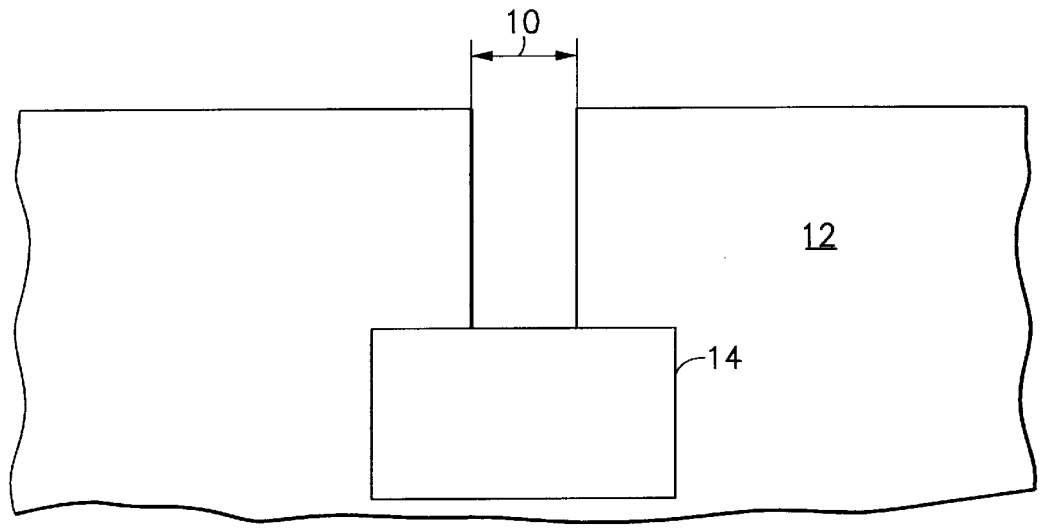
FIG. 1 is a schematic cross-section illustration of a portion an integrated circuit showing a subminimum size via opening to a conductive line in a dielectric layer.
Figure 2:
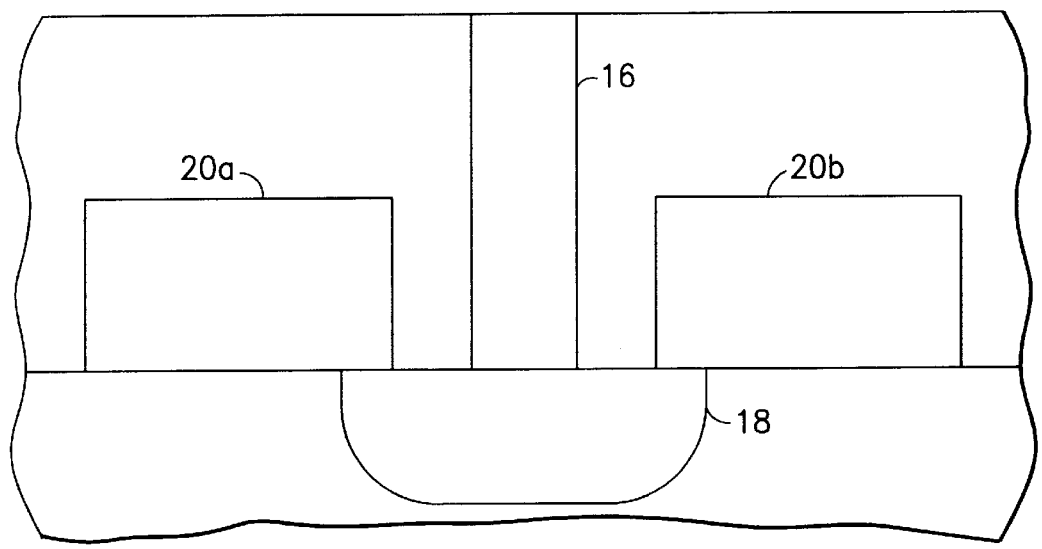
FIG. 2 is a schematic cross-section illustration of a portion of an integrated circuit showing a diffusion contact between two gate conductors in a dielectric layer.
Figure 3:
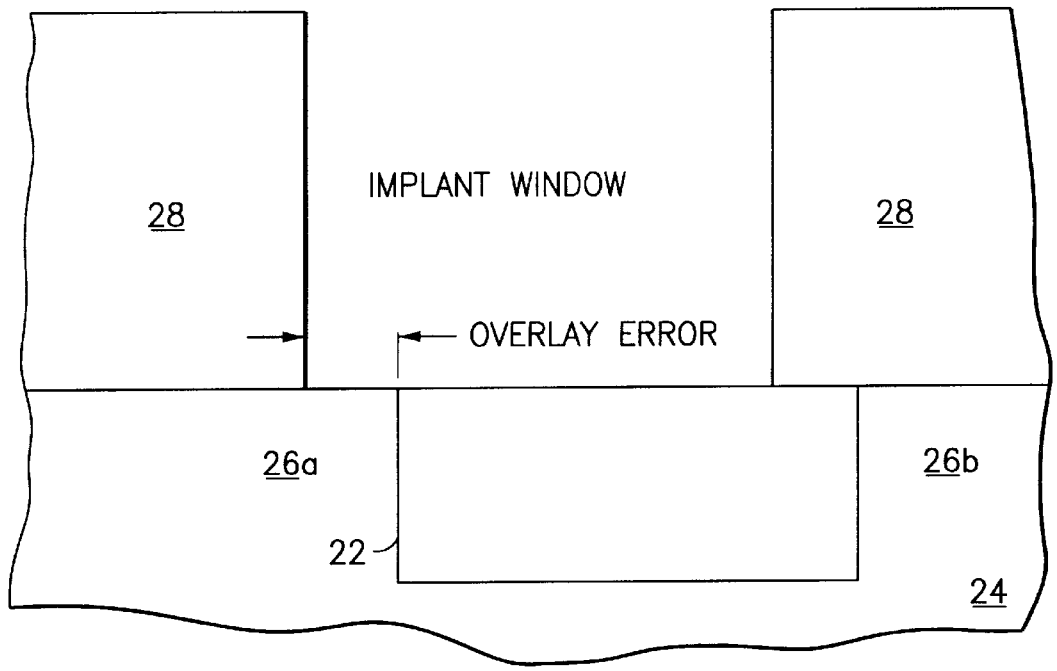
FIG. 3 is a schematic cross-section illustration of a portion of an integrated circuit showing a field implant window in a photoresist layer to a shallow trench isolation region in active device regions when the implant window is misaligned to the STI.
Figure 4:
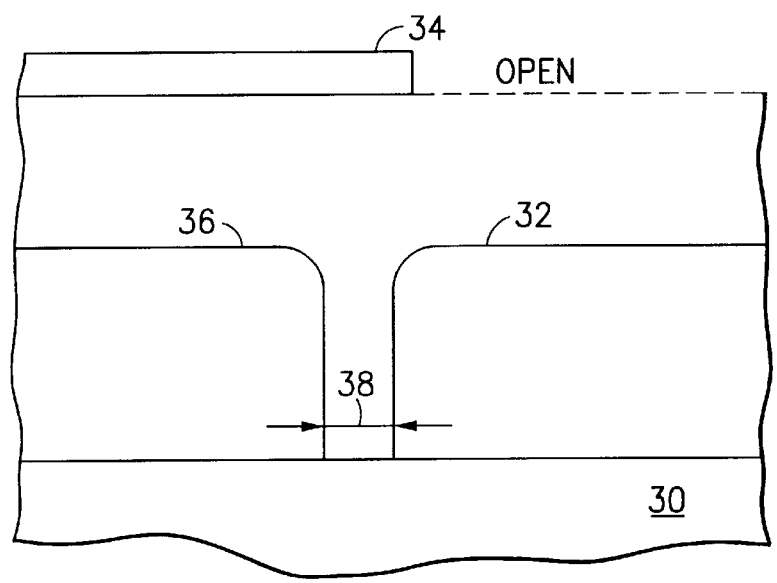
FIG. 4 is a schematic illustration of a cross-section portion of an integrated circuit showing the properties of a dual tone photoresist.

Referring to FIG. 4, a cross-section portion of an integrated circuit is shown illustrating the properties of a dual tone photoresist. In the resist pattern on substrate 30 resulting from exposure and development of dual tone photoresists, the areas of the resist exposed to the light become cross-linked, as with negative resist, and result in what is referred to as the negative tone area 32.

The areas of the resist that were blocked by mask 34 and did not receive any light remain polymerized, as with positive resist, and result in what is referred to as the positive tone area 36.

The areas of the resist that are slightly under the mask edges, such as area 38, receive a small amount of light and depolymerize and do not cross-link. When developed, the resist that is slightly under mask edges is removed from the structure while the other resist remain in the other areas. Due to edge diffraction effects, the width of the region where the resist was removed is approximately one-third of the minimum image resolvable at the wavelength of the light or electromagnetic radiation used to expose the resist.

In the method of the present invention the above-described features of dual tone resist are employed to define and form an implant mask which is used to contain the field implant within a minimum sized isolation region.

Figure 5:
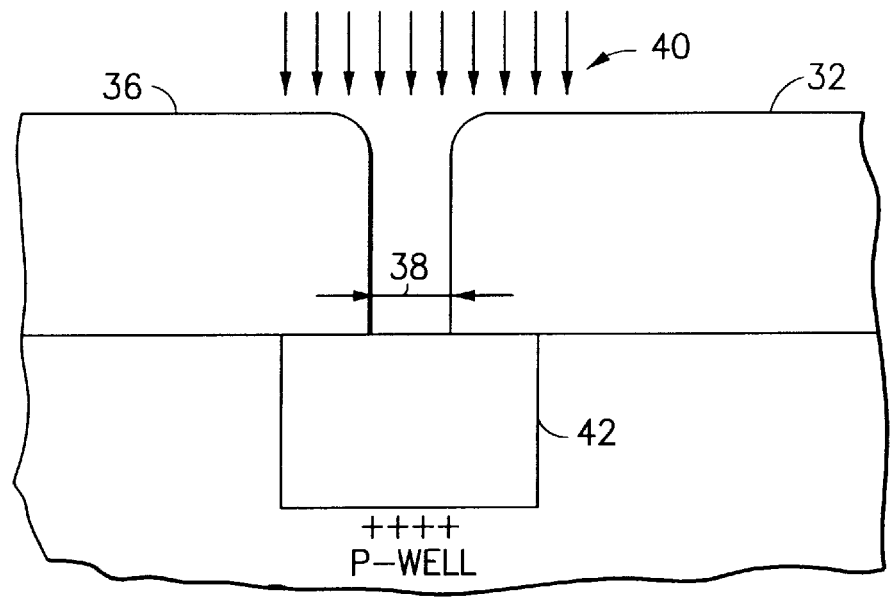
FIG. 5 is a schematic illustration of a cross-section portion of an integrated circuit showing the application of a subminimum width isolation implant in a minimum width isolation region.

Referring to FIG. 5, the resulting photoresist patterns 32 and 36 are shown providing a mask for an ion implant 40 such as boron over a minimum width STI area 42. The mask edges, that is the edges of the resist areas 32 and 36, are aligned such that the mask lies in the middle of the isolation region 42. This assures that, even with the worst case overlay (i.e. ±one-third minimum image size) the opening 38 in the resist falls over the isolation region 42 and not over the active device area.

Figure 6:
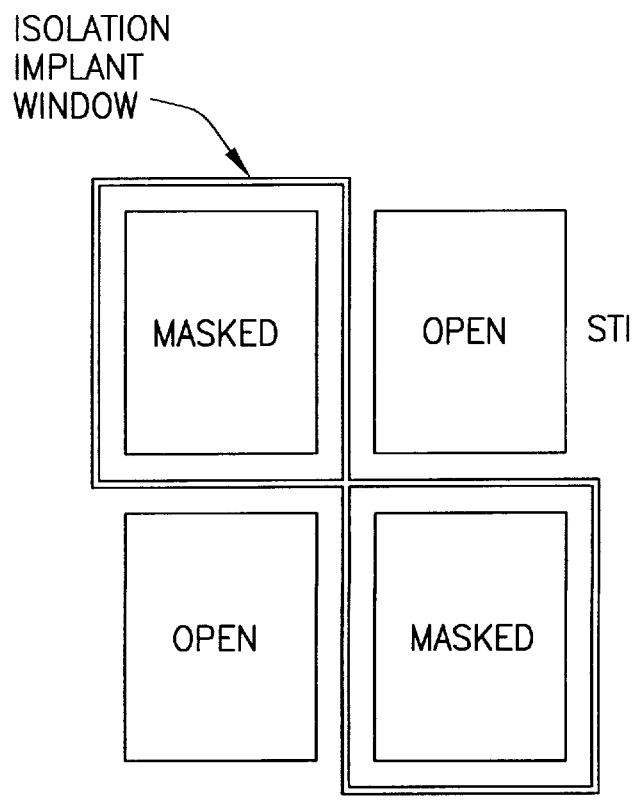
FIG. 6 is a schematic top view of a mask pattern for forming a subminimum isolation implant window within a minimum width shallow trench isolation.

Referring to FIG. 6, a top view of an embodiment of a mask and underlying isolation region between active P-WELL areas formed by the present method is illustrated. The checkerboard pattern of the mask assures that an isolation implant can be contained between the active regions.

Figure 7:
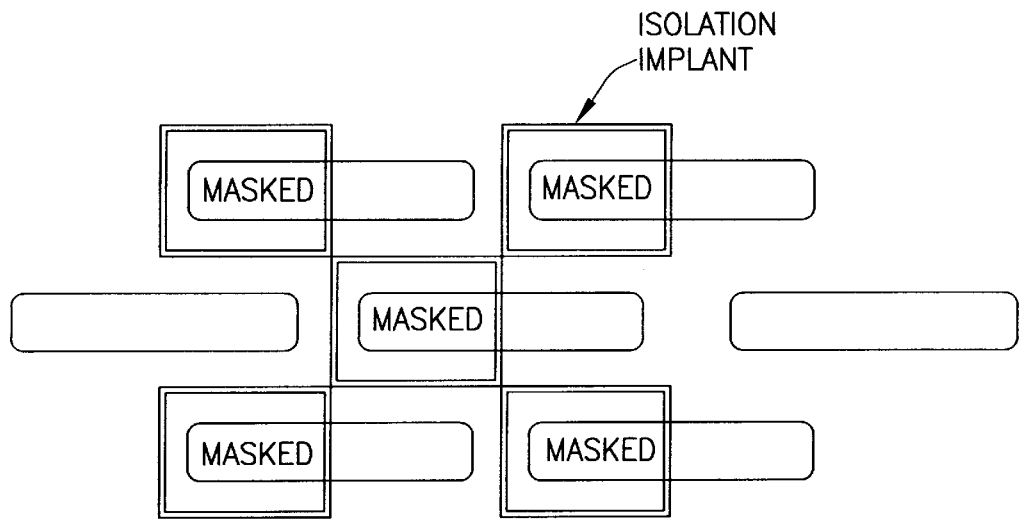
FIG. 7 is a schematic top view of a mask pattern for forming a subminimum implant within a minimum isolation width in a DRAM array.

Referring to FIG. 7, a generic layout of the active area silicon and surrounding STI region is shown in an embodiment of the present invention for a DRAM array. FIG. 7 illustrates the concept of providing a subminimum width field implant within a minimum width isolation space. To maximize density, contemporary DRAMs utilize minimum width isolation in the array whenever possible. In practice, DRAM arrays consist of many more physical features than are shown in FIG. 7. Additional physical features include, but are not limited to wordline conductors, storage capacitor structures, bitline contacts and bitline wiring. The principles of the present invention may be applied to all DRAM array layouts, regardless of the details of the physical features. The invention is also relevant for isolation types other than STI, such as LOCOS and field shield isolation. All designs of DRAM array layouts, architectures and charge storage methods are too numerous to list, however two DRAM array layouts are described herein to illustrate the principle of providing subminimum width field implant fully contained within a minimum width isolation region. Although the principles of the present invention may be applied to all DRAM array layouts, examples of DRAM array layouts which use deep trench storage capacitors and stacked capacitors are discussed.

Figure 8:
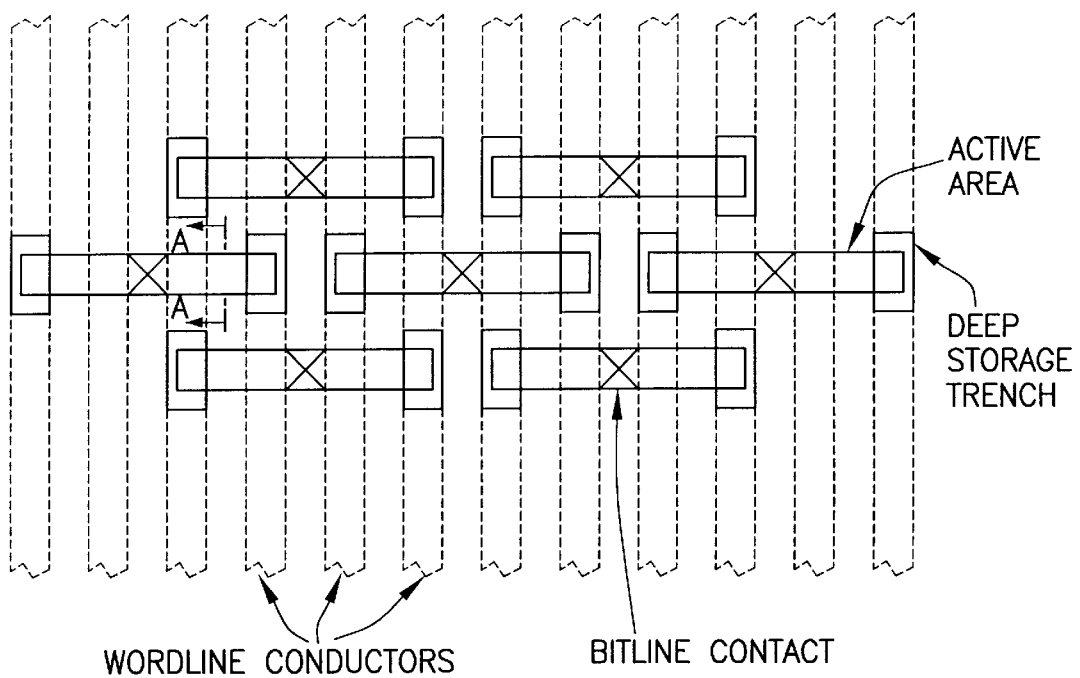
FIG. 8 is a schematic plan view of a DRAM array layout using deep trench storage capacitors.

Referring to FIG. 8, a plan view of the significant physical features of a DRAM array utilizing deep trench storage capacitors is shown. The area of the unit cell is 8 square minimum features. The architecture of the array is known in the art and is referred to as a folded bitline architecture. The deep trench capacitors, wordline conductors, and bitline contacts are shown relative to the geometry of the active silicon area. For purposes of clarity, the bitline conductors are not shown in FIG. 8, however in the structure of FIG. 8 the bitline conductors run horizontally in a direction perpendicular to the wordlines.

Figure 9:
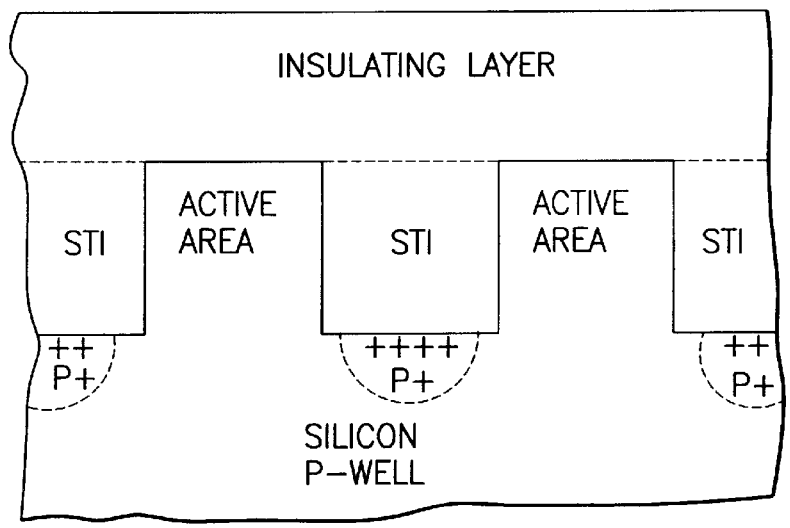
FIG. 9 is a cross-sectional view of a section of the DRAM array of FIG. 8.

Referring to FIG. 9, a cross-sectional view in the plane defined by A—A in FIG. 8. In FIG. 9 it is seen that the P+ field implant is fully contained within minimum width isolation regions. This ensures that the high concentration field implant does not encroach upon the active area regions and degrade device characteristics. Since the field implant does not go into the active areas, it is not necessary to require that the STI be sufficiently deep to keep the high concentration doping away from the array MOSFETs and associated junctions. As a result, the depth of the STI can be reduced from what is presently practiced in the prior art. The resulting benefits of shallower STI include reduced mechanical stress, which leads to fewer silicon defects, lower junction leakage and higher yield. In addition, shallower STI is easier to fill with dielectric material such as CVD oxide because of reduced aspect ratio. This advantage results in lower manufacturing costs. As a result of the present invention, the STI depth can be reduced from 0.25 microns, which is presently practiced, to approximately 0.1 micron.

Figure 10:
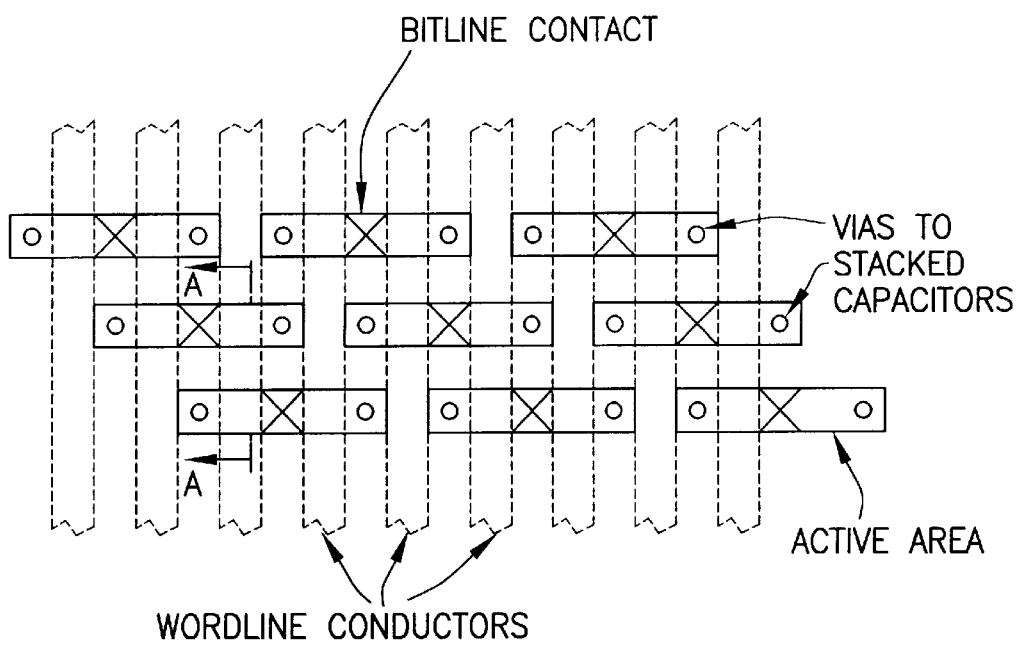
FIG. 10 is schematic plan view of a DRAM array layout using stacked capacitors.

Referring to FIG. 10, a plan view layout is shown of the significant physical features of a stacked capacitor DRAM array. The layout of FIG. 10 represents a design having a unit cell which occupies 6 square minimum features in area. Thus it is more dense than the example of FIGS. 8 and 9. This does not suggest that stacked capacitor cells are denser than trench storage cells, but the embodiments are only used as examples of the application of the present invention. In the stacked capacitor design the storage capacitors are located above the wordline and bitline wiring levels, instead of in deep storage trenches as shown in the previous examples. To improve clarity, the stacked capacitors and the bitline wiring are not shown in FIG. 10. The location of the connecting vias between the array of MOSFETs and the stacked capacitors are indicated in FIG. 10. In FIG. 10 the bitlines run in a direction which is oblique with respect to the wordline direction. This allows the vias to pass between the wordline and bitline wiring.

Figure 11:
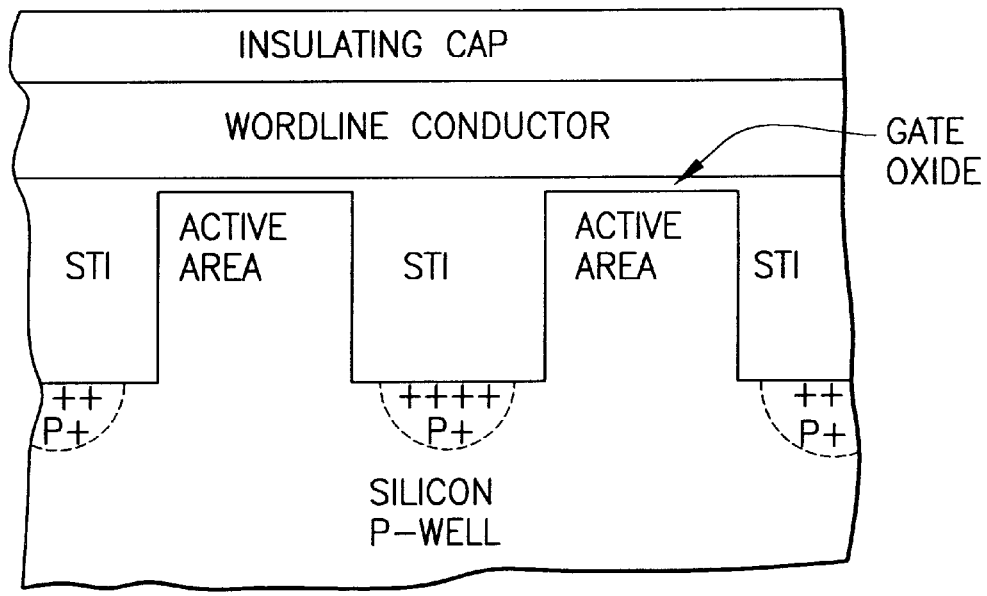
FIG. 11 is a cross-sectional view of a section of the DRAM array of FIG. 10.

Referring to FIG. 11, a cross-sectional view taken in a plane A—A in FIG. 10 is illustrated. As in FIG. 9, the location of the field implant which is fully contained within the isolation width is shown in FIG. 11.

Figure 12:
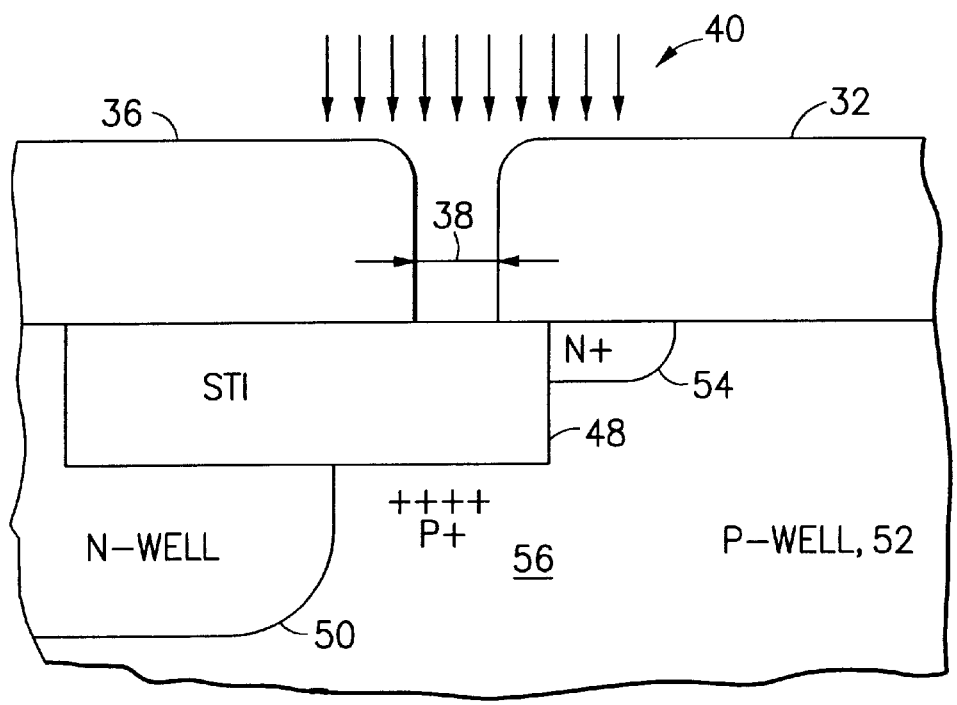
FIG. 12 is a schematic illustration of a cross-section of a portion of an integrated circuit showing a mask pattern for assuring containment of an isolation implant within a minimum width P-WELL region under a shallow trench implant adjacent to an N-WELL.

Referring to FIG. 12, in the case of an isolation region between an N-WELL 50 and P-WELL 52, which is greater than the minimum width to allow for sufficient space between N-WELL 50 and adjacent N+ diffusion 54, a P+ region 56 from an implant 40 can be made into the P-WELL 52 isolation region using the masked dual tone method of the present invention. Layout groundrules have traditionally set the distance between N-WELL 50 edge and N+ diffusion 54 to a value much larger than a minimum, to improve latchup immunity and punchthrough resistance. Using the dual tone resist implant mask, the distance between N-WELL 50 and N+ diffusion 54 may be reduced without introducing detrimental electrical effects.

In FIG. 12, positive tone resist area 36 and negative tone resist area 32 are formed using a layer of dual tone resist as described for FIG. 4. The dual tone resist pattern 32, 36 defines a window 38 for the P+ implant 56 into the P-WELL 52 under the STI 48. This substantially increases latchup trigger voltage and punchthrough voltage without degrading device characteristics.

What has been described is a fabrication method for fully landing minimum or subminimum features on a structure having minimum width features.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

We claim:

1. In a semiconductor processing technology having a predetermined tolerance value and employing a minimum printable image dimension, a method for forming a structure having a dimension at maximum substantially equal to the minimum printable image comprising the steps of;

providing a substrate structure incorporating a lithographic feature having a first minimum printable image dimension;

forming a layer of hybrid photoresist above the lithographic feature of the substrate;

disposing a mask over the hybrid photoresist layer, the mask having an edge aligned with the lithographic feature to within the tolerance of the semiconductor processing technology;

selectively exposing the hybrid photoresist layer through the mask and developing the hybrid photoresist layer to provide a window opening therein which is at maximum substantially equal to the minimum printable image.

2. A method according to claim 1 wherein selectively exposing portions of the hybrid photoresist layer through the mask window produces positive tone resist areas and negative tone resist areas in the hybrid photoresist layer.

3. A method according to claim 2 wherein the portion of the hybrid photoresist layer selectively exposed through the mask window becomes cross-linked and results in a negative tone resist area and wherein the portion of the hybrid photoresist layer blocked by the mask and not exposed remains polymerized and produces a first segment of resist beneath the mask that results in a positive tone area and a second segment of resist beneath the edge of the mask that is results in a depolymerized and not cross-linked area.

4. A method according to claim 3 wherein said developing of said hybrid photoresist layer removes said second segment of resist from said substrate while the rest of said hybrid photoresist layer remains on said substrate.

5. A method according to claim 4 wherein the substrate is a dielectric layer having a conductive line therein beneath the second segment, and wherein the removing of the second segment of the resist provides a via to the conductive line.

6. A method according to claim 4 further including the step of implanting the substrate in the area where the second segment of resist was removed between the positive tone resist area and negative tone resist area and wherein the positive and negative tone resist areas function as a mask for the implanting step.

7. A method according to claim 6 wherein the substrate is a dielectric layer having first and second gate conductors therein and a diffraction region disposed between the first and second gate conductors, wherein the second segment of resist is removed over the diffusion region and wherein the step of implanting forms a borderless contact to the diffusion region that does not short to the gate conductors.

8. A method according to claim 7 wherein the borderless contact is fully landed on the diffusion region.

9. A method according to claim 6 wherein the substrate is a dielectric layer having first and second spaced active device regions therein and wherein the second segment of resist is removed over the space between the first and second active device regions and wherein the step of implanting forms a shallow trench isolation region in the space between the first and second active device regions.

10. A method according to claim 6 wherein the substrate is a layer containing therein an P– isolation region, an N-WELL therein and a N+ diffusion spaced from the N-WELL, and wherein the step of implanting forms a P+ region in the P-WELL isolation region.

* * * * *